US008748220B2

United States Patent
Sydorenko et al.

(10) Patent No.: US 8,748,220 B2
(45) Date of Patent: Jun. 10, 2014

(54) ORGANIC SEMICONDUCTOR COMPOSITIONS INCLUDING PLASTICIZERS

(75) Inventors: Oleksandr Sydorenko, Painted Post, NY (US); Subramanian Vaidyanathan, Mannheim (DE)

(73) Assignee: Alcatel Lucent, Paris (FR)

( * ) Notice: Subject to any disclaimer, the term of this patent is extended or adjusted under 35 U.S.C. 154(b) by 49 days.

(21) Appl. No.: 13/311,358

(22) Filed: Dec. 5, 2011

(65) Prior Publication Data

US 2012/0077308 A1 Mar. 29, 2012

Related U.S. Application Data

(62) Division of application No. 11/616,968, filed on Dec. 28, 2006, now Pat. No. 8,106,386.

(51) Int. Cl.
  *H01L 51/40* (2006.01)
(52) U.S. Cl.
  USPC ............... 438/99; 257/E51.001; 257/40
(58) Field of Classification Search
  USPC .................. 257/40, E51.001; 48/99
  See application file for complete search history.

(56) References Cited

U.S. PATENT DOCUMENTS

| 5,153,681 | A | 10/1992 | Kishimoto et al. |
| 6,752,964 | B1 | 6/2004 | Grubbs et al. |
| 6,797,412 | B1 | 9/2004 | Jain et al. |
| 2004/0038459 | A1 | 2/2004 | Brown et al. |
| 2005/0006656 | A1 | 1/2005 | Jain et al. |
| 2006/0234505 | A1 | 10/2006 | Asano et al. |
| 2007/0272917 | A1* | 11/2007 | Cupertino et al. .............. 257/40 |

OTHER PUBLICATIONS

Pud et al (Prog.Polym.Sci.28(2003) 1701-1753).*
Chua, Lay-Lay, et al., "General Observation of n-type Field-Effect Behaviour in Organic Semiconductors," Nature, Mar. 2005, vol. 434, pp. 194-199.
Dimitrakopoulos, Christos, D., et al., "Organic Thin Film Transistors for Large Area Electronics," Advanced Materials, Jan. 16, 2002, No. 2, pp. 99-117.
Madhavan, Nandita, "Small-Molecule Organic Semiconductors," Organic Chemistry Seminar Abstracts 2001-2002 semester II, University of Illinois at Urbana Champaign, Apr. 1, 2002, pp. 49-56.
Stutzmann, Natalie Stingelin, "Organic Thin-Film Electronics From Vitreous Solution-Processed Rubrene Hypereutectics," Nature Materials, Aug. 2005 vol. 4, published online Jul. 2005 www.nature.com/naturematerials, pp. 601-606.

* cited by examiner

*Primary Examiner* — Matthew W Such
*Assistant Examiner* — Ali Naraghi
(74) *Attorney, Agent, or Firm* — Hitt Gaines, PC

(57) ABSTRACT

A method includes combining organic semiconductor molecules and plasticizer molecules to form over a substrate a solid organic semiconductor channel. The channel may comprise at least about 50% by weight of the plasticizer molecules.

21 Claims, 5 Drawing Sheets

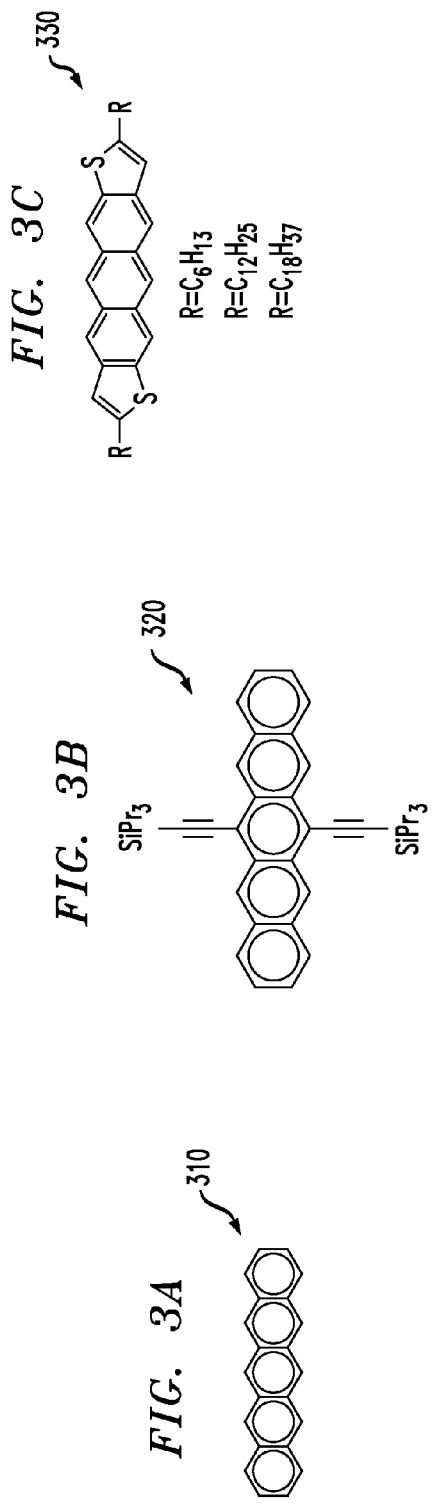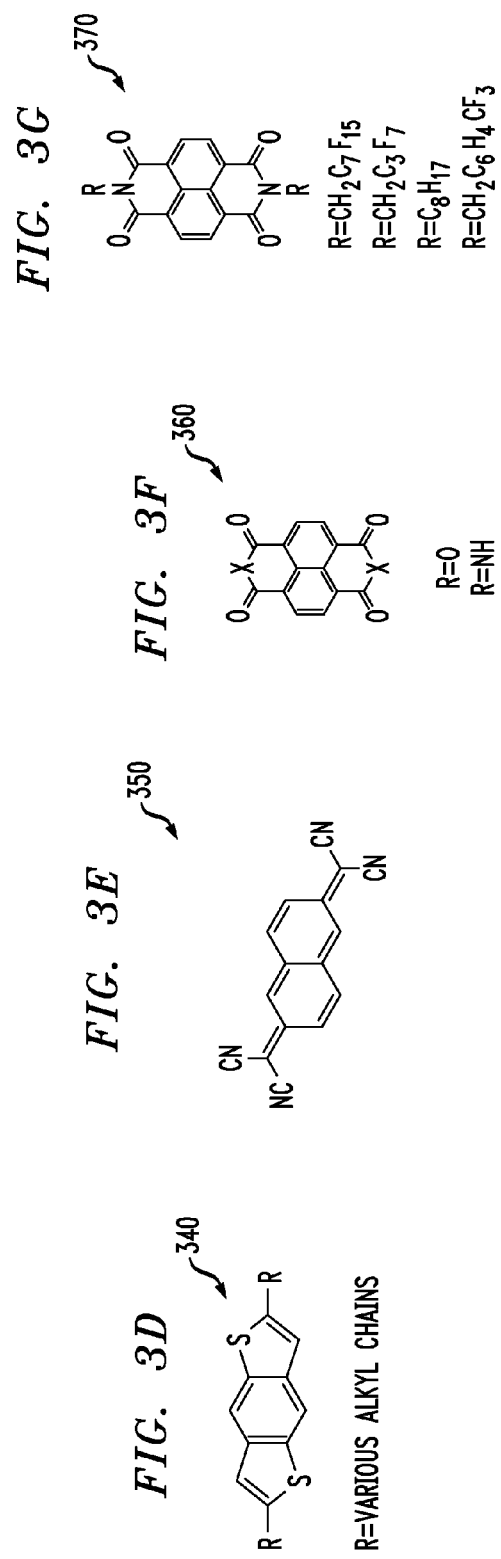

ORGANIC SEMICONDUCTOR COMPOSITIONS INCLUDING PLASTICIZERS

CROSS REFERENCE TO RELATED APPLICATION

This Application is a Divisional of U.S. application Ser. No. 11/616,968 filed on Dec. 28, 2006, to Oleksandr Sydorenko, entitled "Organic Semiconductor Compositions Including Plasticizers," currently allowed, commonly assigned with the present invention and incorporated herein by reference.

TECHNICAL FIELD OF THE INVENTION

The present invention is directed, in general, to organic semiconductors and, more particularly, to organic semiconductor compositions suitable for use in organic field-effect transistors.

BACKGROUND OF THE INVENTION

Organic semiconductors are the subject of intense research because of their potential for low-cost, flexible electronic devices. They have been employed in organic light-emitting diodes (oLEDs) and organic field-effect transistors (oFETs), and in circuits integrating multiple devices. Fabrication techniques such as ink-jet printing have helped reduce the cost of fabrication of these devices and integrated circuits using them.

Flexible electronics demand materials that meet mechanical requirements such as toughness and thermomechanical stability. However, some pure organic semiconducting materials with favorably high charge carrier mobility are relatively brittle in solid form, so the flexibility of a circuit using such materials may be limited. On the other hand, some materials with desirable mechanical properties may have unfavorably low charge carrier mobility.

SUMMARY OF THE INVENTION

One embodiment is a method. The method includes combining organic semiconductor molecules and plasticizer molecules to form over a substrate a solid organic semiconductor channel. The channel comprises at least about 50% by weight of the plasticizer molecules.

Another embodiment is a method that includes combining organic semiconductor molecules and plasticizer molecules to form over a substrate a solid organic semiconductor channel. The plasticizer molecules are a solid at about 25° C. and about 100 kPa.

Yet another embodiment is method. The method includes combining organic semiconductor molecules and plasticizer molecules in a solution having a weight fraction of organic semiconductor molecules to plasticizer molecules ranging from about 5% to about 110%. A solid organic semiconductor channel is formed over a substrate from the solution.

BRIEF DESCRIPTION OF THE DRAWINGS

Various embodiments are understood from the following detailed description, when read with the accompanying figures. Various features may not be drawn to scale and may be arbitrarily increased or reduced in size for clarity of discussion. Reference is now made to the following descriptions taken in conjunction with the accompanying drawings, in which:

FIGS. 3A through 3G illustrate examples of organic nonpolymer semiconducting molecules;

DETAILED DESCRIPTION

One embodiment is a semiconducting solid composition that includes organic semiconductor molecules and plasticizer molecules. The composition may include more than one type of semiconductor molecule or more than one type of plasticizer molecule. The semiconductor molecules are characterized by having semiconducting properties in the solid phase. The mobile charge carriers may be, e.g., electrons or holes, depending on the nature of the semiconductor molecules. If the mobile carriers are negatively charged, e.g., electrons, the composition is n-type, and if the mobile carriers are positively charged, e.g., holes, the composition is p-type.

Figure 1:
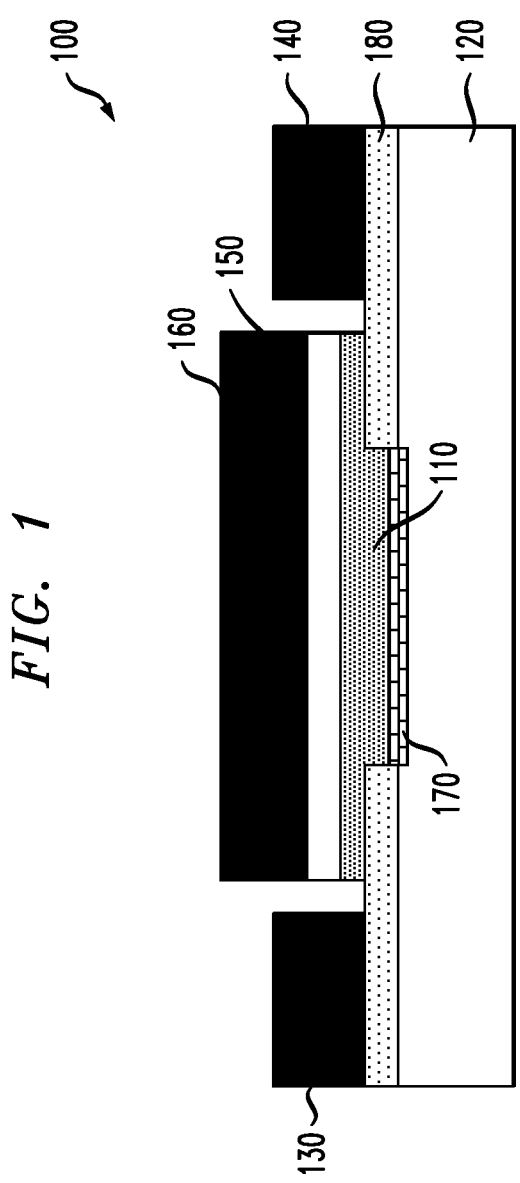
FIG. 1 presents a sectional view of an oFET.
Figure 2A:
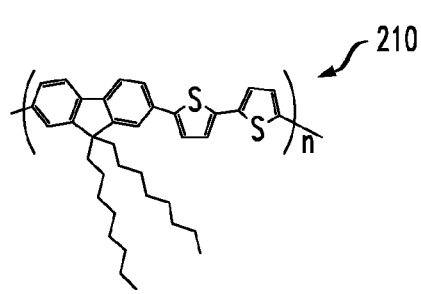
FIGS. 2A through 2E illustrate examples of organic semiconducting polymers.
Figure 2B:
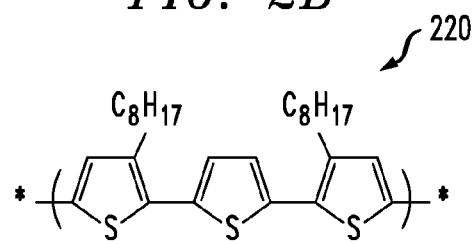
Figure 2C:
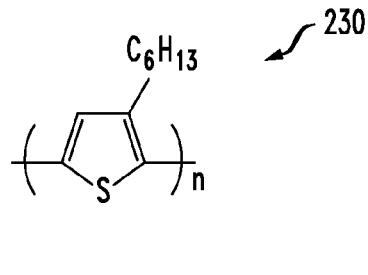
Figure 2D:
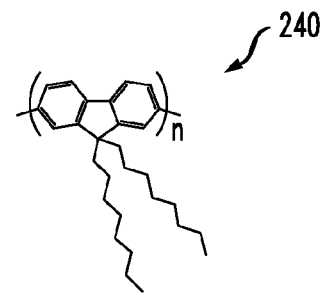
Figure 2E:
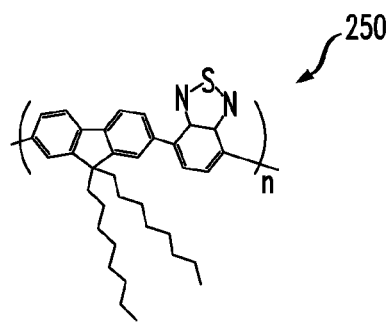

FIG. 1 illustrates an example semiconductor device 100 including a semiconducting solid composition 110 over a substrate 120. The semiconductor device 100 includes source/drain electrodes 130, 140 adjacent the composition 110. A gate dielectric 150 overlies the composition 110 and a gate electrode 160 overlies the gate dielectric 150. As discussed in detail below, an interphase region 170 is present between the composition 110 and the substrate 120.

In one embodiment, the composition 110 includes an organic semiconductor. The organic semiconductor may be a member of two broad classes, polymer and nonpolymer. The first of these classes includes polymers incorporating aromatic or heteroaromatic units, where the units may be fused to each other and/or linked to each other in a way that maintains conjugation. The second is monodisperse compounds incorporating aromatic or heteroaromatic units, where the units may be fused to each other and/or linked to each other in a way that maintains conjugation. As used herein, the term "polymer" conforms to the first class definition, and "non-polymer" conforms to the second.

Non-limiting examples of aromatic or heteroaromatic units of the polymer include bithiophene, fluorene, and benzothiadiazole. Examples of substitutions on these types of polymers that may also have semiconducting properties include, without limitation, alkyl groups, alkoxy groups, ethers, and/or hydroxyl groups.

FIGS. 2A-2E show examples of such polymers. The examples include: poly(9,9-dioctylfluorene-alt-bithiophene (F8T2) 210; poly(3,3'-dioctylterthiophene) (PTT8) 220; regioregular poly(3-hexylthiophene) (P3HT) 230; poly(9,9-dioctylfluorene) (F8) 240; and poly(9,9-dioctylfluorene-alt-benzothiadiazole) (F8BT) 250. Those skilled in the pertinent art will appreciate that these polymers are members of the aforementioned class, and that these examples are not exhaustive of such class members.

Examples of semiconducting nonpolymer molecules are shown in FIGS. 3A-3G. These examples include: processable derivatives of pentacene 310, such as 6,13-bis (triisopropylsilylethynyl)pentacene (TIPS) 320; processable derivatives of anthradithiophene 330 and benzodithiophene 340; tetracyanoquinodimethane 350, naphthalene-1,4,5,8-tetracarboxyl di-anhydride 360, and derivatives 370 of N-substituted naphthalene-1,4,5,8-tetracarboxylic di-imide. Those skilled in the chemical arts will appreciate that this set of example nonpolymers is also not exhaustive.

The composition 110 may include one or more types of semiconducting polymer and/or one or more types of semiconducting nonpolymer molecules. In some embodiments, the organic semiconductor molecules are polymers. In one example, the polymer is F8T2 210. The solid phase of F8T2 210 is generally a p-type semiconductor, and may have an intrinsic p-type carrier mobility of about $1E-4 \text{ cm}^2 \cdot V^{-1} \cdot s^{-1}$. In another example, the polymer is PTT8 220. PTT8 220 is also a p-type semiconductor in the solid phase, and may have an intrinsic p-type carrier mobility of about $4E-3 \text{ cm}^2 \cdot V^{-1} \cdot s^{-1}$.

The substrate 120 may be a polymeric material, and further be nonconducting. In one aspect, the substrate 120 is a polymer film with sufficient strength to support electronic devices formed thereon, and to be used in flexible electronics applications. In another aspect, the substrate 120 is a transparent polymer. In some embodiments, the substrate 120 is a polyester, and may further be polyethylene terephthalate (PET) or a derivative thereof.

In the present embodiment, the composition 110 also includes a plasticizer. In general, a plasticizer is a chemical compound that may promote interdiffusion of the organic semiconductor in the composition 110 and the substrate 120. Such interdiffusion is thought to result in the interphase region 170 between the composition 110 and the substrate 120. In some embodiments, the term "interphase" describes the transitional nature of the interphase region 170 between the phase of the composition 110 and the phase of the substrate 120. Furthermore, the interphase region 170 can be characterized by a smooth concentration gradient of the organic semiconductor from the composition 110 to the substrate 120.

In another aspect, some plasticizers can increase chain mobility of the polymer present in the substrate 120. Chain mobility is the degree to which a portion of a polymer chain may be displaced from one equilibrium position to another. A more mobile polymer chain may be displaced farther or with less energy than a less mobile chain. Sufficient chain mobility of the substrate 120 and the composition 110 is expected to result in the previously described intermixing that results in the formation of the interphase region 170.

The interphase region is thought to improve the electrical properties of the semiconductor device 100. In a p-type semiconductor molecule, conductivity through the solid may occur by two modes. In a first mode associated with greater mobility, holes may move within a single molecule through conjugated π-orbitals. In a second mode, associated with lower mobility, holes may move between molecules by "hopping" between π-orbitals of neighboring molecules. It is believed that the conductivity through the solid is limited by the second mode.

Hopping refers to the transfer of a charge carrier from a localized state of one molecule to a localized state of another molecule. The plasticizer is thought to result in a morphology of the interphase region 170 that is conducive to improved conduction of charge carriers therethrough by increasing the frequency of electron hopping, lowering the energy barrier of hopping, or both. Without limitation by theory, the plasticizer may result in mixing of the organic semiconductor and the substrate 120 in the interphase region 170 in a manner that results in increased overlap between conjugated electron orbitals of neighboring organic semiconducting molecules. Alternatively or in combination with this effect, conduction in the interphase region 170 may be more homogeneous than in the pure organic semiconductor due to a greater amorphous characteristic in the interphase region 170.

Herein, plasticizers refer to a proper subset of the types of molecules that are generically referred to as plasticizers in the scientific literature. The proper subset is limited to generic plasticizers that are both solids at room temperature and pressure ("RTP," about 25° C. and about 100 kPa) and are organic molecules. The plasticizers used in embodiments herein can form substantially homogeneous solid mixtures with organic semiconductors, and the mixtures are stable against moderate changes to ambient environmental conditions such as air pressures and humidity levels. In contrast, generic plasticizers such as $CO_2$ and water may not offer such stability to changes to ambient environmental conditions. In addition, the plasticizers used in embodiments herein are useful in forming electronic devices due to their ability to form solid mixtures with organic semiconductors.

In one aspect, the subset includes those organic compounds that have a core structure that provides one or more sites at which to attach a chemical subgroup to the core. In another aspect, the subset includes those plasticizers incorporating aromatic or heteroaromatic units. In yet another aspect, the subset may include those plasticizers having a moiety with a chemical affinity for the organic semiconductor in the composition 110 or the substrate 120.

Derivatives of phthalic acid are a family of plasticizers that have found broad utility in organic materials, some of which have attributes of the described subset. One group of such derivatives includes phthalate esters, the general form of which is shown below. Numerous phthalate esters are known and commercially available.

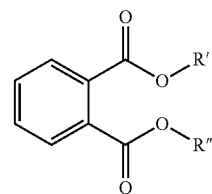

Plasticizers that are solid at RTP include, e.g., phthalate esters for which at least one pendant group R', R" of the compound is a cyclic moiety. In one aspect, two pendant groups are cyclic moieties. In another aspect, the pendant groups comprise rings with six or more members. The cyclic moieties may additionally comprise one or more side groups. Examples of such plasticizers, shown below, include dibenzyl phthalate (DBP), dicyclohexyl phthalate (DCHP), and diphenyl phthalate (DPP), having approximate melting points of 42° C., 62° C., and 72° C., respectively.

Isophthalates are a related chemical subset that may include the characteristics set forth for a suitable plasticizer. An example of an isophthalate having a melting point above RTP is diphenyl isophthalate, shown below, with a melting point of about 136° C. Those skilled in the chemical arts will appreciate that this set of example plasticizers is not exhaustive.

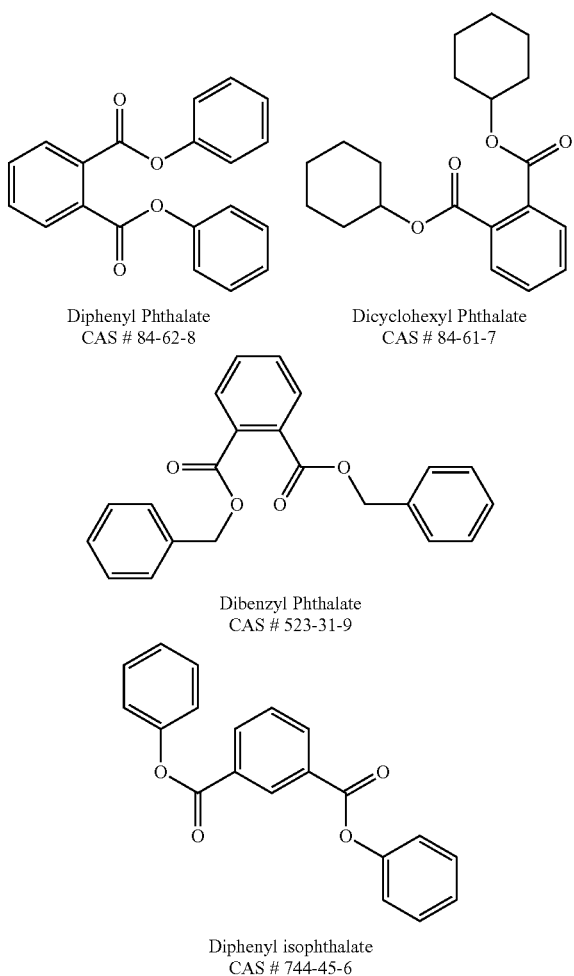

Diphenyl Phthalate
CAS # 84-62-8

Dicyclohexyl Phthalate
CAS # 84-61-7

Dibenzyl Phthalate
CAS # 523-31-9

Diphenyl isophthalate
CAS # 744-45-6

In some cases, the melting point of the plasticizer is thought to be associated with the degree to which the plasticizer will promote the formation of the interphase region 170. More specifically, in some cases a plasticizer that is liquid at an operating temperature of the composition 110 may result in phase separation at the interface between the composition 110 and the substrate 120. Such separation may lead to lubrication of the interface and reduced mixing of the organic semiconductor and the substrate 120. Conversely, a plasticizer with a melting point above the operating temperature may remain in solid solution with the organic semiconductor to produce a stable interphase region 110 as described herein.

In some embodiments, the composition 110 may comprise at least about 50% by weight of the plasticizer. In other embodiments, the composition 110 may comprise at least about 60% by weight of the plasticizer. In still other embodiments, the composition 110 may comprise at least about 70% by weight of the plasticizer. Moreover, the composition 110 may include more than one type of plasticizer molecule. In further embodiments, the thickness of the composition 110 ranges from about 50 nm to about 200 nm. It is thought that for some concentrations of plasticizer, this range of thickness results in advantageous mobility of the charge carriers in the composition 110.

In one example, the composition 110 comprises about 20% by weight F8T2 210 and about 80% by weight DCHP. The composition is formed on a substrate comprising PET. An oFET in this configuration has a measured mobility about a factor of 10 greater than the mobility of a control oFET using intrinsic F8T2 210. In another embodiment, the composition 110 comprises about 50% by weight PTT8 220 and about 50% by weight DCHP. This composition has a measured mobility about a factor of 10 greater than the mobility of a control oFET using intrinsic PTT8 220.

Another embodiment is a method of fabricating a circuit. The method comprises forming an organic semiconductor channel over a substrate so that the channel comprises a solid mixture of semiconducting organic molecules and plasticizer molecules. Electrodes are formed over the substrate, the electrodes being located to function as a gate electrode, a drain electrode, and a source electrode of an FET. The active channel of the FET comprises the semiconductor.

FIGS. 4A-4E illustrates such a method 400 of forming an oFET 405. For illustration purposes, the method 400 is presented assuming a top gate oFET. Those skilled in the art will appreciate, however, that several architectures may be used to form an oFET, including bottom gate, top gate, and coplanar structures.

Figure 4A:
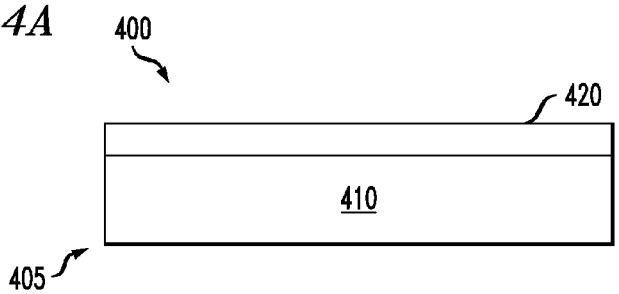
FIGS. 4A through 4E illustrates a method of forming an oFET using the composition comprising organic molecules and plasticizer molecules.

In FIG. 4A, a substrate 410 is provided with a conductive layer 420 thereon. As used herein, the substrate 410 and the conductive layer 420 are provided when obtained from any source or formed by any currently existing or future discovered method. In one aspect, the substrate 410 is a polymer with which a plasticizer may form a stable solid phase. In one embodiment, the substrate 410 is PET.

The conductive layer 420 may be a conventional layer. In some cases, the conductive layer 420 is transparent. In other cases, the conductive layer is a polymer. In one embodiment, the conductive layer 420 is a derivative of polythiophene. In some cases, the conductive layer 420 is poly(3,4-ethylenedioxythiophene) (PEDOT). The conductive layer 420 may be applied to the substrate 410 by conventional means such as silk-screening or spin casting. Alternatively, a bilayer film including a layer of PEDOT preformed on a PET film may be used.

Figure 4B:
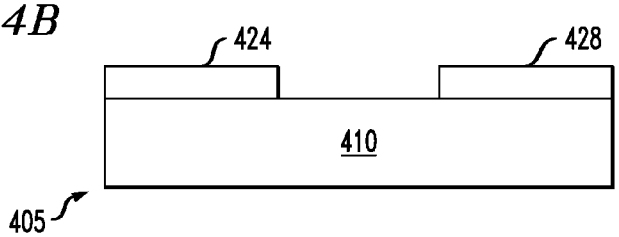

In FIG. 4B, the conductive layer 420 has been patterned to expose the substrate 410. The patterning may be performed conventionally by, e.g., a plasma or chemical etch with a masking layer. The patterning results in remaining raised portions 424, 428, i.e., portions of the conductive layer 420 that were not removed due to the presence of protective mask material during the patterning. Alternatively, the conductive layer 420 may be omitted and the portions 424, 428 may be applied to the substrate 410 by a printing method, such as screen or jet printing.

Figure 4C:
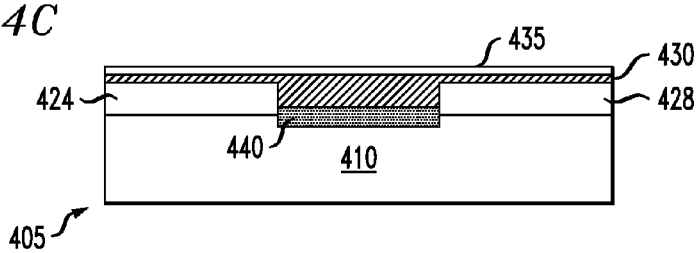

In FIG. 4C, a channel layer 430 is formed over the exposed portion of the substrate 410. The channel layer 430 includes an organic semiconductor and a plasticizer, and may be further include the composition 110 previously described. In one embodiment, the channel layer 430 is deposited from a solution including the organic semiconductor and the plasticizer. An interphase region 440 is formed as previously described between the channel layer 430 and the substrate 410.

Formation of the channel layer 430 may be accomplished by dip-coating, spin-coating or jet-spraying a solution of the organic semiconducting molecule and the plasticizer. In one embodiment, the organic semiconductor is F8T2 210. In another embodiment, the organic semiconductor is PTT8 220. In another embodiment, the plasticizer is a phthalate ester, and may be DCHP.

A conventional dielectric layer 435 may be formed over the channel layer 430 to insulate a later-formed gate electrode from the channel layer 430. In some cases, the dielectric layer 435 may be an insulating polymer cast from a solvent by jet spraying, or dip-coating, e.g. In other cases, the dielectric layer 435 may be formed by chemical vapor deposition of a polymer such as parylene.

Figure 5:
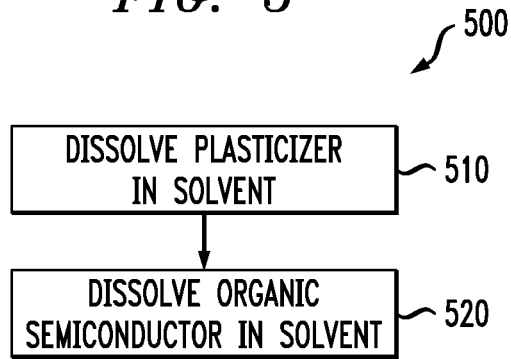
FIG. 5 illustrates a method of forming a composition including organic molecules and plasticizer molecules.

FIG. 5 illustrates a method 500 of forming the solution including the organic semiconducting molecule and the plasticizer. In a step 510, a quantity of plasticizer is dissolved in a solvent that dissolves both the plasticizer and the organic semiconductor. Such a solvent is referred to herein as a "mutual solvent." In one aspect, the mutual solvent is a polar solvent. In some cases, the mutual solvent has a dipole moment of at least about 1.5 Debye, or about 5E-30 C-m. Without limitation, one such solvent is tetrahydrofuran (THF). The dissolving may be aided by the use of stirring or ultrasonic energy.

The concentration of plasticizer dissolved in the mutual solvent will depend on the relative concentration of plasticizer desired in the channel layer 430. In some cases, the concentration of plasticizer in the mutual solvent may range from about 1% by weight to about 20% by weight. Factors that may be relevant in selecting a particular concentration include the desired viscosity of the final solution, the deposition method, and the final thickness desired.

In a step 520, a quantity of the organic semiconductor is dissolved in the mutual solvent. The dissolving may be again be aided by the use of stirring or ultrasonic energy. In some cases, the concentration of organic semiconductor may range from about 5% of the plasticizer concentration to about 110% of the plasticizer concentration. The ratio that results in desirable performance characteristics of the oFET will depend in part on the material used for the substrate 410. The choice of material may depend in turn on the architecture selected for the oFET.

In one example, a carrier mobility of about 1.4e-3 $cm^2 \cdot V^{-1} \cdot s^{-1}$ results when a ratio of about 5:1 of DCHP to F8T2 210 is used on a PET substrate. In another example, a carrier mobility of about 5e-3 $cm^2 \cdot V^{-1} \cdot s^{-1}$ results when a ratio of about 1:1 of DCHP to F8T2 210 is used on a PET substrate. In each of these examples, the measured mobility is about a factor of ten greater than control oFETs using the corresponding intrinsic organic semiconducting polymer.

While the described embodiment describes dissolving the plasticizer in the mutual solvent first, followed by the organic semiconductor, the order of dissolving may be reversed. In another aspect, separate solutions of the plasticizer and the organic semiconductor in the mutual solvent may be prepared. If so, the two solutions may be mixed in the desired proportions to result in the desired concentrations and ratio of plasticizer and organic semiconductor.

Returning to FIG. 4C, in one embodiment the channel layer 430 is formed by dip-coating. The withdrawal rate of the substrate 410 and the viscosity of a solution prepared as described above may be adjusted to result in the desired thickness of the channel layer 430. After formation of the channel layer 430, the dielectric layer 435 is formed thereover. The thickness of the dielectric layer 435 will depend on the desired turn-on voltage of the oFET 405. One of ordinary skill in the art may determine appropriate process parameters and thickness of the dielectric layer 435 without undue experimentation.

Figure 4D:
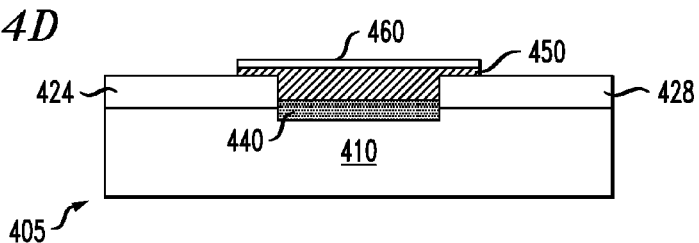

In a FIG. 4D, the dielectric layer 435 and the channel layer 430 may be patterned using conventional means to produce an organic semiconducting channel 450 and a gate dielectric 460. In the case that the dielectric layer 435 and the channel layer 430 are deposited by jet-spraying, patterning may be unnecessary.

Figure 4E:
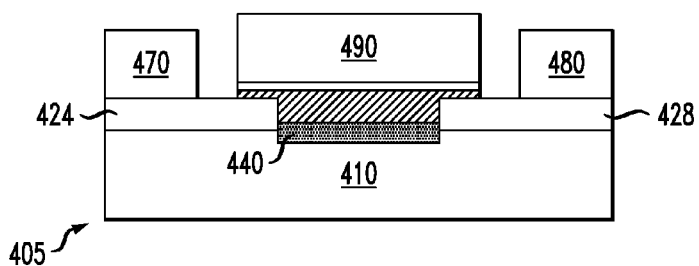

In FIG. 4E, electrical contacts 470, 480 and a gate electrode 490 are conventionally formed over the substrate 410. Formation may be performed, e.g., by deposition of gold using a shadow mask or a conductive resin. The remaining portions 424, 428 and the electrical contacts 470, 480 operate as source/drain electrodes of the oFET 400.

As described previously, an organic semiconducting channel 450 comprising F8T2 210 and DCHP prepared in the manner described herein may have a carrier mobility about ten times the mobility of carriers in intrinsic F8T2 210. Thus, the oFET 400 may have a switching speed about ten times the switching speed of an oFET using intrinsic F8T2 210 as the channel material. Moreover, the ratio of on-current ($I_{on}$) to off-current ($I_{off}$) and the mechanical properties of the oFET 400 are comparable to an oFET formed using intrinsic F8T2 210.

Another embodiment is an apparatus. The apparatus comprises an electronic device having a first and a second electrode in contact with an organic semiconducting channel comprising the composition 110 described herein.

Figure 6:
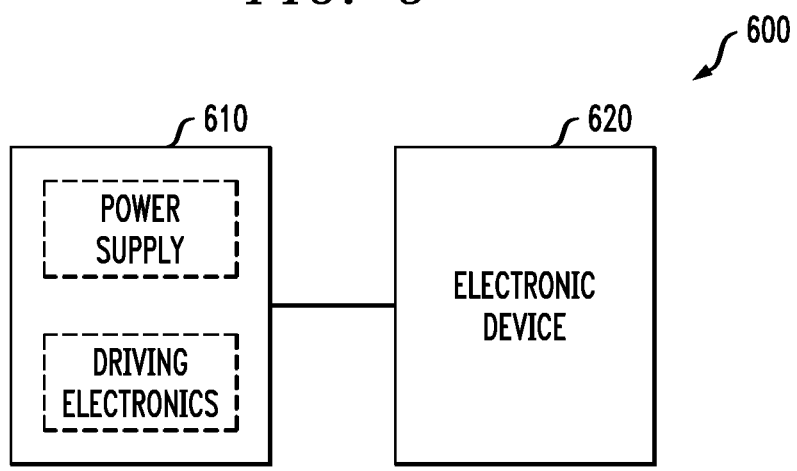
FIG. 6 illustrates an example apparatus.

FIG. 6 shows such an example apparatus 600. Electronics 610 may comprise a power supply and driving electronics to interface to an electronic device 620. The electronic device 620 is formed as described herein, and has an organic semiconducting channel comprising the composition 110 described herein. The electronic device 620 may comprise a gate electrode located to produce an electric field at the surface of the channel. The electronic device 620 may additionally be an oFET fabricated by the aforementioned method.

Although the present invention has been described in detail, those skilled in the pertinent art should understand that they can make various changes, substitutions and alterations herein without departing from the spirit and scope of the invention in its broadest form.

What is claimed is:

1. A method, comprising:
    combining organic semiconductor molecules and plasticizer molecules to form over a substrate a solid organic semiconductor channel comprising at least about 50% by weight of the plasticizer molecules, wherein the plasticizer molecules are a solid at about 25° C. and about 100 kPa.

2. The method of claim 1, further comprising forming a plurality of electrodes over the substrate, the electrodes being located to function as a gate electrode, a drain electrode, and a source electrode of an FET.

3. The method of claim 1, wherein the combining includes dissolving the organic semiconductor molecules and plasticizer molecules in a mutual solvent.

4. The method of claim 3, wherein the mutual solvent has a dipole moment of at least about 5E-30 C-m.

5. The method of claim 3, further comprising forming a solution having a weight fraction of organic semiconductor molecules to plasticizer molecules ranging from about 5% to about 110%.

6. The method of claim 1, wherein the channel is formed by jet-spraying.

7. The method of claim 1, wherein the plasticizer comprises a phthalate ester.

8. The method of claim 1, wherein said channel includes a solid solution of said organic semiconductor molecules and said plasticizer molecules.

9. A method, comprising:
    combining organic semiconductor molecules and plasticizer molecules to form over a substrate a solid organic semiconductor channel, wherein said plasticizer molecules are a solid at about 25° C. and about 100 kPa.

10. The method of claim 9, further comprising forming a plurality of electrodes over the substrate, the electrodes being located to function as a gate electrode, a drain electrode, and a source electrode of an FET.

11. The method of claim 9, wherein the channel comprises at least about 50% by weight plasticizer molecules.

12. The method of claim 9, wherein the organic semiconductor molecules comprise a monodisperse compound.

13. The method of claim 9, wherein the plasticizer molecule comprises at least one pendant group, the at least one pendant group comprising a cyclic moiety.

14. The method of claim 9, wherein the plasticizer comprises a phthalate ester.

15. The method of claim 9, wherein said channel includes a solid solution of said organic semiconductor molecules and said plasticizer molecules.

16. A method, comprising: combining organic semiconductor molecules and plasticizer molecules in a solution having a weight fraction of organic semiconductor molecules to plasticizer molecules ranging from about 5% to about 110% and the plasticizer molecules include a phthalate ester; and forming from said solution a solid organic semiconductor channel over a substrate, wherein the plasticizer molecules are a solid at about 25 C and about 100 kpa.

17. A method, comprising:
combining organic semiconductor molecules and plasticizer molecules in a solution having a weight fraction of organic semiconductor molecules to plasticizer molecules ranging from about 5% to about 110% and the plasticizer molecules include a phthalate ester; and
forming from said solution a solid organic semiconductor channel over a substrate, wherein the phthalate ester includes a pendant group covalently bonded to at least one oxygen atom of the phthalate ester, the pendant group having a cyclic moiety.

18. The method of claim 17, further comprising forming plurality of electrodes over the substrate, the electrodes being located to function as a gate electrode, a drain electrode, and a source electrode of an FET.

19. The method of claim 17, wherein the phthalate ester includes an isophthalate.

20. A method, comprising:
combining organic semiconductor molecules and plasticizer molecules in a solution having a weight fraction of organic semiconductor molecules to plasticizer molecules ranging from about 5% to about 110% and the plasticizer molecules include a phthalate ester; and
forming from said solution a solid organic semiconductor channel over a substrate, wherein said plasticizer molecules are a solid at about 25° C. and about 100 kPa.

21. The method of claim 20, further comprising forming plurality of electrodes over the substrate, the electrodes being located to function as a gate electrode, a drain electrode, and a source electrode of an FET.

* * * * *